(12) United States Patent
Wakahara et al.

(10) Patent No.: US 6,713,954 B2
(45) Date of Patent: Mar. 30, 2004

(54) LIGHT-EMITTING ELEMENT

(75) Inventors: Akihiro Wakahara, Toyohashi (JP);
Tomohiko Shibata, Kasugai (JP);
Osamu Oda, Nishikasugai-gun (JP);
Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 79 days.

(21) Appl. No.: 10/097,275

(22) Filed: Mar. 15, 2002

(65) Prior Publication Data

US 2002/0158569 A1 Oct. 31, 2002

(30) Foreign Application Priority Data

Mar. 27, 2001 (JP) ........................................ 2001-089092

(51) Int. Cl.[7] .............................. H01J 1/62; H01J 63/04
(52) U.S. Cl. ....................... 313/498; 313/499; 313/506; 313/495; 257/428
(58) Field of Search ................................ 313/498–512, 313/495–497; 257/428, 429; 438/22, 29, 46; 250/207, 310, 214 VT

(56) References Cited

U.S. PATENT DOCUMENTS

| | | | | |
|---|---|---|---|---|
| 5,751,021 A | * | 5/1998 | Teraguchi | ............. 257/103 |
| 5,959,401 A | * | 9/1999 | Asami et al. | ............. 313/503 |
| 6,277,664 B1 | * | 8/2001 | Lozykowski et al. | ......... 438/22 |
| 6,400,070 B1 | * | 6/2002 | Yamada et al. | ............. 313/310 |
| 6,455,870 B1 | * | 9/2002 | Wang et al. | .................. 257/12 |
| 6,593,016 B1 | * | 7/2003 | Chiyo et al. | ............... 428/698 |
| 6,605,895 B2 | * | 8/2003 | Hori et al. | ................... 313/506 |
| 2002/0043926 A1 | * | 4/2002 | Takahashi et al. | .......... 313/503 |

FOREIGN PATENT DOCUMENTS

JP          2000091703 A   *   3/2000   ........... H01S/5/323

* cited by examiner

Primary Examiner—Vip Patel
Assistant Examiner—German Colón
(74) Attorney, Agent, or Firm—Oliff & Berridge PLC

(57) ABSTRACT

A light-emitting element includes a transparent substrate, a III-V nitride semiconductor layer including rare earth metal elements which is formed on said transparent substrate, and an irradiation source of electron beam which is disposed within 5 mm from the surface of said III-V nitride semiconductor layer so as to be opposite to said III-V nitride semiconductor layer. Then, the rare earth metal elements in the III-V nitride semiconductor layer are excited by electron beams from the irradiation source and a given fluorescence inherent to the rare earth metal elements are emitted.

7 Claims, 1 Drawing Sheet

LIGHT-EMITTING ELEMENT

BACKGROUND OF THE INVENTION (1) Field of the Invention

This invention relates to a light-emitting element. Particularly usable for emitting a white light.

(2) Related Art Statement

As a light-emitting element for illumination, a normal light source such as a incandescent lamp and fluorescent lamp and also, a light-emitting diode (LED) which is made by stacking plural semiconductor layers are used. Since a white light includes three elementary colors, and can be emitted from the incandescent lamp or fluorescent lamp, the use of the incandescent lamp or fluorescent lamp enables a given object to be observed in full color.

On the other hand, since only a monochromatic light is emitted from the LED, and determined by the structure of the LED, the full color observation can not be realized. Recently, however, a LED to emit a white light are being developed actively. For example, such a white LED as using RGB or using two elementary colors constructed of a blue LED and yellow fluorescent substances coated on the blue LED is fabricated as prototypes.

Moreover, an ultraviolet LED is fabricated and then, a white LED is fabricated as prototypes, using fluorescences from the three elementary color fluorescent substances through the irradiation of an ultraviolet beam from the ultraviolet LED. This technique is based on the principle of a fluorescent lamp, and in this case, the ultraviolet LED is used in place of mercury discharge inside the fluorescent lamp.

However, since the incandescent lamp is emitted by heating the filament, much electric power is consumed.

Moreover, since the white LED using RGB requires different LED chips, the cost rises, so that it has difficulty in making it practicable for lighting. Then, since the white LED using two elementary colors can not be used for the full color observation because it utilizes only two elementary colors, not three elementary colors. Similarly, since the white LED using the ultraviolet LED requires the fluorescent substances of the three elementary colors, separately, the cost rises. Then, if a GaN-based blue LED is modified into the ultraviolet LED so as to emit a light beam of shorter wavelength, the luminance efficiency is deteriorated remarkably.

Moreover, since the LED itself emit a light beam by utilizing a pn junction between the semiconductor layers, it has the inherent difficulty due to the pn junction control. Particularly, if such an attempt is made as to fabricate the LED of an AlGaInN-based semiconductor material, it is very difficult to fabricate a p-type semiconductor layer.

SUMMARY OF THE INVENTION

It is an object of the present invention to provide a new light-emitting element without the above-mentioned problems.

For achieving the above object, this invention relates to a light-emitting element, including a transparent substrate, a III-V nitride semiconductor layer including rare earth metal elements which is formed on the transparent substrate, and an irradiation source of electron beam which is disposed within 5 mm from the surface of the III-V nitride semiconductor layer so as to be opposite to the III-V nitride semiconductor layer, whereby the rare earth metal elements in the III-V nitride semiconductor layer are excited by electron beams from the irradiation source and a given fluorescence inherent to the rare earth metal elements are emitted.

For achieving the above object, the inventors had been intensely studied, to obtain a new light-emitting element which is different in principle and structure.

In the light-emitting element according to the present invention, since the rare earth metal elements are excited, to generate and emit a light, originated from the fluorescence of the rare earth metal elements, the chromaticity of the light can be varied freely by selecting rare each metal elements.

Also, by selecting two kinds or over of rare earth metal element and mixing them at a given ratio, the chromaticity of the light to be obtained can be varied largely.

Moreover, if Tm to generate a light within blue color wavelength region, Er to generate a light within green color wavelength region and Eu or Pr to generate a light within red color wavelength region are selected and mixed appropriately at a given ratio, the fluorescences from these rare earth metal elements are superimposed, to generate and emit a white light.

Therefore, according to the light-emitting element, the present invention, a white light can be easily generated, compared with a conventional LED. In addition, the difficulty of pn junction control which is inherent to a LED can be eliminated.

A carbon nano-tube may be adopted as the irradiation source of electron beam, and if the distance between the irradiation source and the III-V nitride semiconductor layer is set to be smaller, the light-emitting element can be illuminated below commercial voltage. Moreover, since the current required to drive the light-emitting element can be set to be extremely small, the electric power consumption can be reduced, compared with a incandescent lamp.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to the accompanying drawings.

Figure 1:
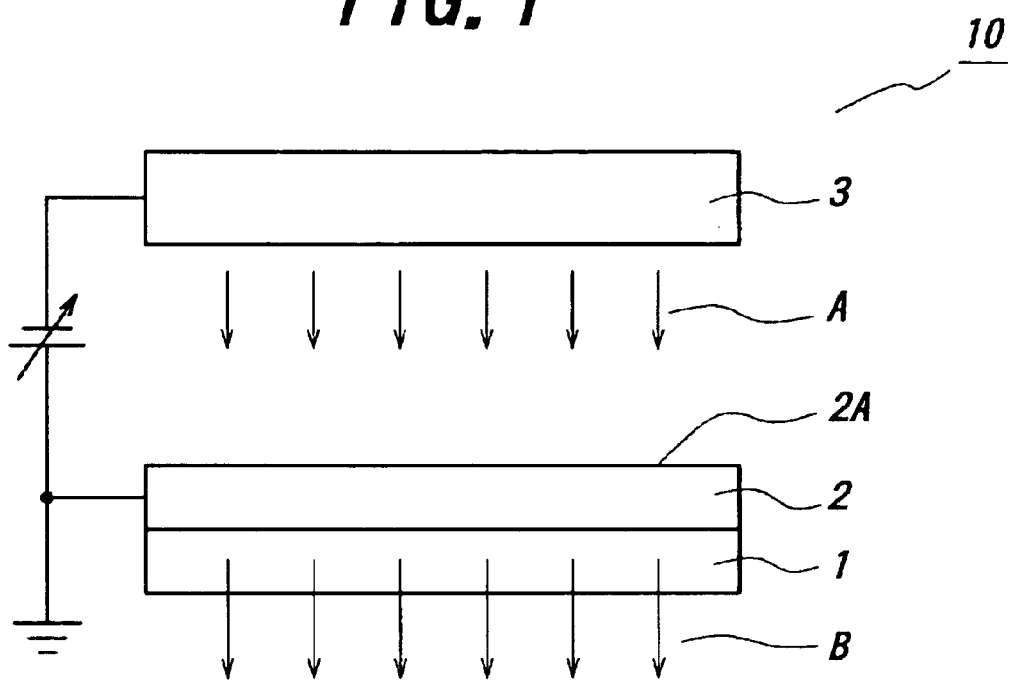
FIG. 1 is a structural showing a light-emitting element according to the present invention.

FIG. 1 is a structural showing a light-emitting element according to the present invention. A light-emitting element 10 depicted in FIG. 1 includes a transparent substrate 1 and a III-V nitride semiconductor layer 2 containing rare earth metal elements which is formed on the transparent substrate 1. Then, an irradiation source of electron beam 3 is provided so as to be opposite to the semiconductor layer 2.

When a given voltage is applied between the irradiation source 3 and the semiconductor layer 2, electron beams A are irradiated from the irradiation source 3, and then, irradiated onto the main surface 2A of the semiconductor layer 2. In this case, the electron beams are absorbed by the rare earth metal elements contained in the semiconductor layer 2, and thus, the rare earth metal elements are excited, to illuminate a given fluorescence inherent to the rare earth metal elements. The fluorescence is taken out, as a light B, of the light-emitting element via the transparent substrate 1.

Herein, for preventing the static electricity originated from the electron beams A from the irradiation source 3, the semiconductor layer 2 is electrically grounded. Therefore, by selecting the rare earth metal elements appropriately in the semiconductor layer 2, the chromaticity of the light B can be varied freely.

The space in between the irradiation source 3 of electron beam and the semiconductor layer 2 is evacuated into vacuum, and is held in a given vacuum degree, as occasion demands.

If two kinds or over of rare earth metal are incorporated in the III-V nitride semiconductor layer 2, the fluorescences from the two kinds or over of rare earth metal are superimposed, and thus, the chromaticity of the light B can be widely varied.

Then, if Tm as a light source within blue color wavelength region, Er as a light source within green color wavelength region and Eu or Pr as a light source within red color wavelength region are selected and mixed appropriately at a given ratio, the fluorescences from these rare earth metal elements are superimposed, to generate and emit a white light. That is, a white light can be easily obtained, compared with a conventional LED.

The content of the rare earth metal elements is not restricted, but preferably, the rare earth metal elements are incorporated in the semiconductor layer 2 as much as possible, in order to generate the fluorescence in sufficient intensity. Concretely, the content of the rare earth metal elements is set within 0.01–7 atomic percentages.

A semiconductor material to form the III-V nitride semiconductor layer 2 may be generally represented by a molecular formula of $Al_xGa_yIn_{1-x-y}N$ ($0 \leq x$, $y \leq 1$), and for giving conduction, an additive element such as Mg, Si, B may be incorporated as occasion demands. As elements or Sb elements may be partially substituted for N elements of the semiconductor layer 2. Moreover, the semiconductor layer 2 is not always made of a single crystal, but may be made of a polycrystal.

For incorporating the rare earth metal elements as much as possible and thus, developing the luminance intensity from the rare earth metal elements, the semiconductor layer 2 is made of a semiconductor material having a larger band-gap. In this point off view, it is desired as the Al content of the semiconductor material consisting of semiconductor layer is increased. Concretely, it is desired that the Al content is set to 50 atomic percentages or over for all of the III elements of the semiconductor material, particularly 100 atomic percentages. That is, it is most preferable that the semiconductor layer 2 is made of AlN.

The semiconductor layer 2 may be made by a conventional method such as a CVD method, a MOCVD method or a MBE method. The addition of the rare earth metal elements can be performed by using a raw material gas including the rare earth metal elements as component at the film-forming by a CVD method or the like. Moreover, a given rare earth metal element source may be used at a MBE method.

In addition, after the semiconductor layer 2 is made by a given conventional method, the rare earth metal elements may be implanted as ions to incorporate into the semiconductor layer 2.

As the irradiation source 3 of electron beam, a beam source of Si, AlN or $LaB_6$ may be employed, in addition to the above-mentioned carbon nano-tube. Then, if the distance between the irradiation source 3 and the semiconductor layer 2 is set to 5 mm or below, the light emitting element 10 can be illuminated at a lower voltage than a commercial voltage. For example, if the distance between the irradiation source 3 and the semiconductor layer 2 is set to about 1 mm and a commercial voltage of 100 V is employed, the electrical field intensity is set to a higher value of 100 kV/cm.

The transparent substrate 1 may be made of sapphire, quartz glass, other oxide material, ceramic material or semiconductor material.

Figure 2:
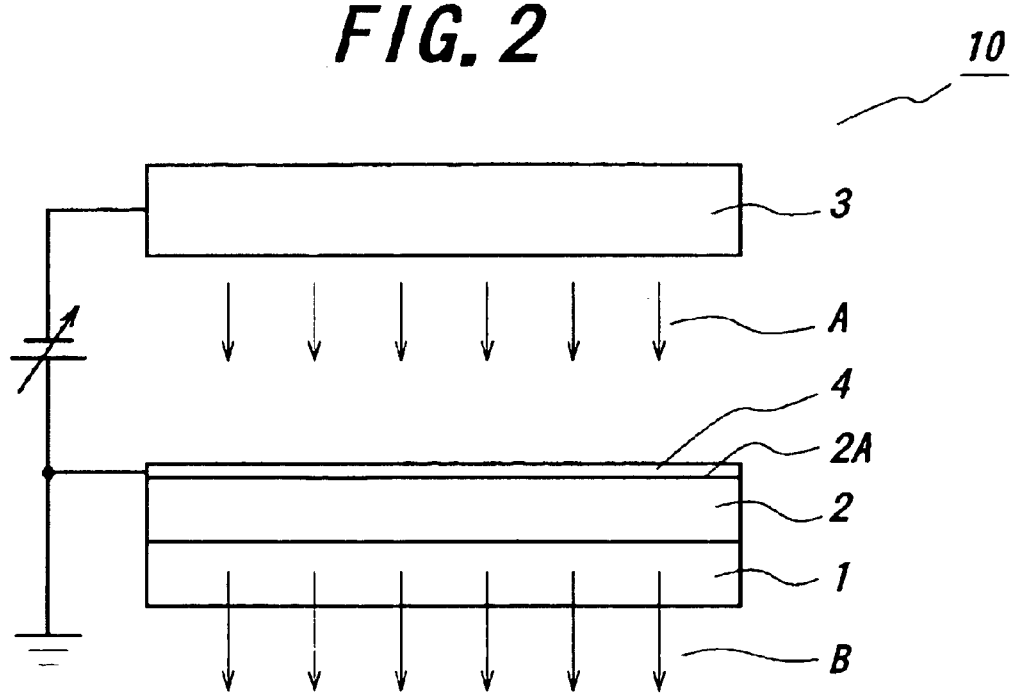
FIG. 2 is a structural view showing a modified light-emitting element from the one shown in FIG. 1.

FIG. 2 is a structural view showing a modified light-emitting element from the one shown in FIG. 1. In this embodiment, the same reference number is given to the component similar to the one in the above embodiment shown in FIG. 1. A light-emitting element 10 depicted in FIG. 2 includes a conductive film 4 on the main surface 2A of a III-V nitride semiconductor layer 2. The conductive film 4 is electrically grounded. Therefore, the static electricity originated from the electron beams A from the irradiation source 3 can be prevented effectively, and thus, the light-emitting element 10 can be operated stably for a long period of time.

The conductive film 4 may be made of metal such as Au, Ti or Pt, conductive oxide such as ITO, and conductive semiconductor compound such as n-type AlGaN and p-type AlGaN.

EXAMPLE

In this example, a light-emitting element as shown in FIG. 1 was fabricated.

A sapphire single crystal substrate having a diameter of 2 inches and a thickness of 430 $\mu$m was employed as the transparent substrate 1, and was heated up to 1000° C. Then, trimethylaluminum (TMA), trimethylgallium (TMG) and an ammonia ($NH_3$) gas were supplied onto the sapphire single crystal substrate, to form an $Al_{0.5}Ga_{0.5}N$ film as the semiconductor layer 2 in a thickness of 2 $\mu$m. At the same time, given organic metallic gases or halogenated metallic gases such as ReCl, Re(DPM) and so forth, were supplied onto the sapphire single crystal substrate, to incorporate Er, Tm, Pr and Eu elements into the $Al_{0.5}Ga_{0.5}N$ film.

When electron beams were irradiated onto the $Al_{0.5}Ga_{0.5}N$ film from the irradiation source 3, it was confirmed that a white light having an intensity of 50 L/W is generated and emitted from the thus obtained light-emitting element. That is, it was confirmed that the light-emitting element is usable as a practical element for illumination.

Although the present invention was described in detail with reference to the above examples, this invention is not limited to the above disclosure and every kind of variation and modification may be made without departing from the scope of the present invention.

As mentioned above, according to the present invention, the rare earth metal elements are incorporated in the III-V nitride semiconductor layer formed on the transparent substrate 1, and the electron beams are irradiated for the rare earth metal elements. In this case, the rare earth metal elements are excited, to emit the inherent fluoresce. Therefore, by selecting the rare earth metal elements appropriately, a light of a given chromaticity, particularly a white light can be easily generated and emitted.

Moreover, since such a harmful substance as mercury is not employed, there is no problem in waste disposal. In addition, by selecting the irradiation source of electron beam appropriately and setting the distance between the irradiation source and the semiconductor layer to be smaller than a given value, the light-emitting element can be operated at a lower voltage than a commercial voltage, and thus, the electrical power consumption can be lowered remarkably.

What is claimed is:

1. A light-emitting element, comprising:

a transparent substrate, a III-V nitride semiconductor layer including rare earth metal elements which is formed on said transparent substrate, and an irradiation source of electron beam which is disposed within 5 mm from the surface of said III-V nitride semiconductor layer so as to be opposite to said III-V nitride semiconductor layer with a vacuum in between the source and the layer, whereby said rare earth metal elements in said III-V nitride semiconductor layer are excited by electron beams from said irradiation source and a given fluorescence inherent to said rare earth metal elements are emitted.

2. A light-emitting element as defined in claim 1, wherein said III-V nitride semiconductor layer includes two kinds or over of rare earth metal element.

3. A light-emitting element as defined in claim 2, wherein said III-V nitride semiconductor layer includes first rare earth metal element to generate a light within blue color wavelength region, second rare earth metal element to generate a light within green color wavelength region and third rare earth metal element to generate a light within red color wavelength region, and thus, a white light is generated and emitted entirely.

4. A light-emitting element as defined in claim 1, further comprising a conductive film on the surface opposite to said irradiation source of said III-V nitride semiconductor layer.

5. A light-emitting element as defined in claim 4, wherein said conductive film is made of at least one selected from the group consisting of metal, conductive oxide and conductive semiconductor compound.

6. A light-emitting element as defined in claim 4, wherein said III-V nitride semiconductor layer includes two kinds or over of rare earth metal element.

7. A light-emitting element as defined in claim 6, wherein said III-V nitride semiconductor layer includes first rare earth metal element to generate a light within blue color wavelength region, second rare earth metal element to generate a light within green color wavelength region and third rare earth metal element to generate a light within red color wavelength region, and thus, a white light is generated and emitted entirely.

* * * * *